United States Patent
Testino

(10) Patent No.: US 9,185,809 B2
(45) Date of Patent: Nov. 10, 2015

(54) METHOD FOR PRODUCING AN ELECTRICAL MULTI-LAYER COMPONENT AND ELECTRICAL MULTI-LAYER COMPONENT

(75) Inventor: Andrea Testino, Genoa (IT)

(73) Assignee: EPCOS AG, Munich (DE)

(*) Notice: Subject to any disclaimer, the term of this patent is extended or adjusted under 35 U.S.C. 154(b) by 338 days.

(21) Appl. No.: 13/642,505

(22) PCT Filed: Apr. 18, 2011

(86) PCT No.: PCT/EP2011/056132
§ 371 (c)(1),
(2), (4) Date: Feb. 7, 2013

(87) PCT Pub. No.: WO2011/131620
PCT Pub. Date: Oct. 27, 2011

(65) Prior Publication Data
US 2013/0126222 A1    May 23, 2013

(30) Foreign Application Priority Data

Apr. 22, 2010  (EP) .................................... 10160759

(51) Int. Cl.
*H05K 3/02*   (2006.01)
*H05K 3/10*   (2006.01)
(Continued)

(52) U.S. Cl.
CPC .............. *H05K 3/125* (2013.01); *H01C 7/1006* (2013.01); *H01C 17/065* (2013.01); *H05K 1/0298* (2013.01); *H05K 1/167* (2013.01); *H05K 1/0306* (2013.01); *H05K 2201/10196* (2013.01)

(58) Field of Classification Search
CPC ........... H05K 2201/0195; H05K 3/125; H01L 23/49822; H01L 21/4857; Y10T 29/49126; Y10T 29/49128; Y10T 29/49002; Y10T 29/4913; Y10T 428/24562; Y10T 428/24942; B32B 2315/02

USPC ................ 29/846, 619, 825, 829; 156/89.12, 156/89.17, 89.18; 174/50.51, 258, 262
See application file for complete search history.

(56) References Cited

U.S. PATENT DOCUMENTS 6,087,923 A    7/2000  Ahn et al.
6,228,196 B1 *  5/2001  Sakamoto et al. ......... 156/89.17
(Continued)

FOREIGN PATENT DOCUMENTS

CN    1707703 A    12/2005
CN    101416259 A    4/2009
(Continued)

OTHER PUBLICATIONS

Albertsen, et al., "Combined Manufacture Methods for high density LTCC-substrates: thick film screen-printing, ink-jet, post-firing thin film processes and laser-drilled fine-vias", CICMT, 2008 (retrieved Mar. 22, 2010), pp. 000604-000610.
(Continued)

*Primary Examiner* — Thiem Phan
(74) *Attorney, Agent, or Firm* — McDermott Will & Emery LLP

(57) ABSTRACT

A method for producing an electrical multi-layer component is described, wherein a first ceramic layer (2) comprising a first and a second ceramic material (3, 4) is applied to a ceramic substrate (1). The first ceramic material (3) is applied to a first surface partition (5) of the substrate (1) by a first inkjet printing step and the second ceramic material (4) is applied to a second surface partition (6) of the substrate (1) by a second inkjet printing step, the second surface partition (6) surrounding and enclosing the first surface partition (5). The second ceramic material (4) is different from the first ceramic material (3).

Furthermore, an electrical multi-layer component is described.

15 Claims, 3 Drawing Sheets

(51) Int. Cl.
*H05K 3/12* (2006.01)
*H01C 7/10* (2006.01)
*H01C 17/065* (2006.01)
*H05K 1/02* (2006.01)
*H05K 1/16* (2006.01)
*H05K 1/03* (2006.01)

(56) References Cited

U.S. PATENT DOCUMENTS

| | | |
|---|---|---|
| 7,416,938 B2 | 8/2008 | Seh et al. |
| 7,505,247 B2 | 3/2009 | Lee |
| 7,593,215 B2 | 9/2009 | Lee et al. |
| 7,741,949 B2 * | 6/2010 | Inoue et al. ............... 338/21 |
| 2008/0026136 A1 | 1/2008 | Skamser et al. |
| 2008/0266750 A1 | 10/2008 | Wu et al. |
| 2009/0128281 A1 | 5/2009 | Chen |
| 2010/0294549 A1 | 11/2010 | Laville |
| 2012/0044039 A1 | 2/2012 | Feichtinger et al. |

FOREIGN PATENT DOCUMENTS

| | | |
|---|---|---|
| JP | 09219339 | 8/1997 |
| JP | 2004172369 A | 6/2004 |
| JP | 2006287201 A | 10/2006 |
| JP | 2010027882 A | 2/2010 |
| WO | 2007115238 A2 | 10/2007 |
| WO | 2009095559 A2 | 8/2009 |
| WO | 2010089294 A1 | 8/2010 |

OTHER PUBLICATIONS

Ceradrop CeraPrinter video located at http://www.ceradrop.fr/en/products.html, 2010 (retrieved Jan. 6, 2015), pp. 1-2, CERADROP.

* cited by examiner

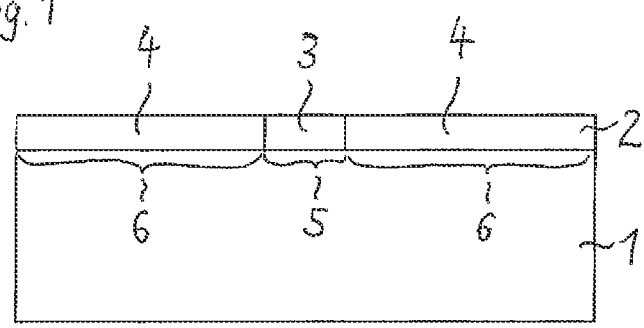
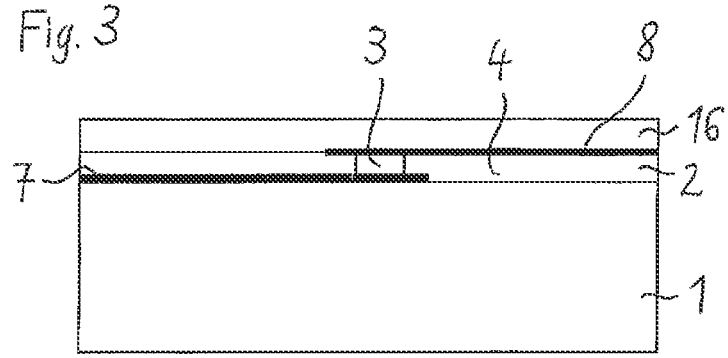

METHOD FOR PRODUCING AN ELECTRICAL MULTI-LAYER COMPONENT AND ELECTRICAL MULTI-LAYER COMPONENT

A method for producing an electrical multi-layer component and an electrical multi-layer component are described.

Many electronic components require a low capacity while maintaining optimal other particular properties. Low capacity varistors having capacities of less than 0.5 pF, for example, are required for high data transfer rate devices with bandwidths greater than 2 Gbit/s maintaining a low varistor voltage of less than 50 V. Another example are low capacity varactors with capacities of less than 10 pF which are required for instance for high frequency applications with frequencies greater than 500 MHz maintaining a high tunability of more than 3. These trade-offs can be achieved by a proper design, for instance by a reduction of the dielectric surface between two metal electrodes maintaining a constant ceramic thickness and grain size.

In the state of the art several attempts are known to decrease the dielectric surface area.

For example, using screen printing and multilayer stacking production techniques, the reduction of the dielectric surface may be achieved by decreasing the overlap area between two screen printed electrodes. However, for mass production, the technical limit of the reduction of the overlap area, which can be achieved for example by reducing the respective widths of crossed electrode lines, can only be achieved with a tolerance of at least 20% of the electrode width. The tolerance, however, induces a rather high capacity spread among the final components.

A small dielectric area can also be achieved by punching vias on a ceramic support and filling up the holes with the dielectric material by local micro-injection. However, the minimum diameter of still refillable vias prepared with this technology limits the minimum thickness of the support tape that leads to constraints on the minimum thickness of the dielectric material in the vias.

Alternatively, vias can be made by laser ablation in a ceramic sheet and can be filled by screen printing with metal paste. Usually, the dielectric layer is situated below the ceramic sheet and a continuous metal electrode is screen printed on the other side. Although such metal vias can be quite small in diameter, technical problems often arise due to difficulties to proper refill such small vias so that this process provides no sufficient reliability.

Another method to achieve a small dielectric volume is the method of film deposition. For example when using PVD (physical vapor deposition), in gas phase under vacuum the dielectric material is transferred from a bulk target to a support which is protected by a mask in areas that are not to be covered by the dielectric material. However, this technique is rather expensive and requires lots of energy. It also requires a multistep photolithographic processing and is generally applied for the preparation of thin film deposition, wherein a deposited ceramic layer shows nanometric grains. However, in some applications, for instance varistors or varactors, thick films with rather big grains are needed.

It is an object of some embodiments of the invention to provide a method for producing an electrical multi-layer component without the need of machining and refilling vias in at least one ceramic layer. It is another object of some embodiments to provide an electrical multi-layer component.

These objects are achieved by means of the subject matters of the independent patent claims. The dependent patent claims relate to advantageous methods and configurations.

According to at least one embodiment, a method for producing an electrical multi-layer component comprises the step of applying a first ceramic layer to a ceramic substrate wherein the first ceramic layer comprises a first and a second ceramic material and the first ceramic material is different from the second ceramic material. In particular, the first ceramic material is applied to a first surface partition of the substrate by a first inkjet printing step and the second ceramic material is applied to a second surface partition of the substrate by a second inkjet printing step. The second surface partition surrounds and encloses the first surface partition.

Due to the first inkjet printing step, the first ceramic material can be disposed on the ceramic substrate covering a small first surface partition. Depending for example on the choice of the first and the second ceramic materials, advantageously a small active surface of the electrical multilayer component can be achieved by the method described herein.

Furthermore, due to the first and second inkjet printing steps the above-mentioned problems related to the precision in cutting and stacking of screen printed sheets can be overcome.

The second surface partition surrounding and enclosing the first surface partition may imply that, after having performed the first and second inkjet printing step, the second ceramic material laterally surrounds and encloses the first ceramic material, wherein "laterally" denotes a direction along the extension plane of the first ceramic layer. Preferably, the first and the second ceramic materials can be applied directly adjacent to each other so that the first ceramic material and the second ceramic material, which laterally surrounds and encloses the first ceramic material, form a continuous first ceramic layer.

The first and/or the second inkjet printing step may include at least one step of providing a suitable ink for printing the first and/or the second ceramic material onto the ceramic substrate. The respective ink may comprise the first or second ceramic material in combination with suitable additional materials, for example suitable solvents and binders, so that drops containing the first or second ceramic material can be printed onto the ceramic substrate by means of the first or second inkjet printing step, respectively. The drops, which may have a size or diameter of equal or less than 30 μm, can be printed laterally adjacent to each other and/or on top of each other so that the first and the second ceramic material each can form a three-dimensional structure and, in particular, a layer structure with a certain thickness.

Advantageously, due to the method described herein it may be possible to apply a first ceramic layer onto the ceramic substrate which has even a complex three-dimensional structure without the need of forming and filling vias.

Either one or two or a plurality of inkjet print heads can be involved in the printing process comprising the first and second inkjet printing step. Typically, at least two inkjet print heads are involved, one spraying ink comprising the first ceramic material, the other spraying ink comprising the second ceramic material. The second ceramic material may be applied in the second inkjet printing step after applying the first ceramic material in the first inkjet printing step. Alternatively, the second inkjet printing step may be performed at the same time as the first inkjet printing step. In other words, the first and the second ceramic material may be applied simultaneously.

After having applied the ink by the inkjet print heads, the solvents may be removed in one or more drying steps. Advantageously, the inkjet printing of the first and second ceramic materials can occur in a single processing protocol, alternating the printing and drying steps. Afterwards, the multi-layer component may be sintered by heating in a sintering furnace so that the first and second ceramic materials may form an integral layer. Advantageously, the first ceramic material is suited for co-firing with the second ceramic material. In case that the multi-layer component comprises further ceramic and/or additional metal layers, the first ceramic layer may be sintered together with the further and/or additional layers.

According to a further embodiment, the first surface partition to which the first ceramic material is applied has a surface area which is equal to or smaller than 500 µm times 500 µm, preferably equal to or smaller than 200 µm times 200 µm, more preferably equal to or smaller than 100 µm times 100 µm. The surface area can have the shape of a rectangle or of a circle or of any other form according to the requirements of the multi-layer component. If not otherwise explicitly mentioned, here and in the following a specification of a surface area refers to the dimension rather than to the shape of the surface area.

According to another embodiment, the first ceramic layer has a thickness of equal to or less than 100 µm, preferably of equal to or less than 50 µm and more preferably of equal to or less than 20 µm. This may imply that the first ceramic material and/or the second ceramic material may have a thickness as small as the aforementioned thicknesses.

Such very small dimensions of the diameter and thickness of the first ceramic material can be advantageously achieved by inkjet printing without the need of punching vias into a ceramic material, since the second ceramic material, in turn, is also applied to the ceramic substrate by inkjet printing. Thus, problems related to the production and refilling of vias in ceramic sheets or layers can be avoided.

According to another embodiment, a first electrode layer is applied to the substrate before applying the first ceramic layer. Afterwards, the first ceramic layer may be applied upon the first electrode layer and a second electrode layer may be applied to the first ceramic layer. The first and second electrode layer may be inkjet printed so that, advantageously, the dimensions and shapes of the first and second electrode layer can be for example adapted to the first and/or second surface partition, i.e. to the shapes and dimensions of the first and second ceramic material. Alternatively, the first and second electrode layer may be deposited by means of other technologies, such as screen printing or sputtering. In a preferred variant of this embodiment, the first and second electrode layer are in direct contact with the first ceramic material. In this case, the first ceramic can serve as a functional medium between the first and the second electrodes, for example as a dielectric medium.

According to another embodiment, the second ceramic material has a relative permittivity which is smaller than the relative permittivity of the first ceramic material. The relative permittivity is a material property known to a person skilled in the art and provides a measure of the extent to which a material concentrates electric flux lines. In a preferred variant of this embodiment, the ratio of the relative permittivity of the first ceramic material to the relative permittivity of the second ceramic material is equal to or greater than 10. Thus, the electric flux lines can be concentrated within the first ceramic material and stray fields within the multi-layer component can be minimized.

According to a further embodiment, the first ceramic material is a ceramic material with particular electronic properties, such as a varactor or a varistor material.

For instance, the first ceramic material can be barium strontium titanate which has a high relative permittivity of typically more than 500, enclosed by the second ceramic material that for example can be magnesium oxide with a lower relative permittivity of approximately 10.

According to another embodiment, a third ceramic material is applied to at least a third surface partition of the substrate by a third inkjet printing step and the second surface partition surrounds and encloses the third surface partition. The third ceramic material and the first ceramic material may be the same or different materials depending on the required properties of the first ceramic layer. The first ceramic layer can be formed in a complex way featuring a multitude of small structures in the form of the first and the third and if necessary further ceramic materials which can have the same or different functionalities according to the requirements of the multi-layer component.

According to a further embodiment, at least a second ceramic layer is applied to the substrate upon or below the first ceramic layer. The second ceramic layer may comprise a fourth and a fifth ceramic material. The fourth ceramic material may be applied upon a fourth surface partition of the substrate by a fourth inkjet printing step and the fifth ceramic material may be applied upon a fifth surface partition of the substrate by a fifth inkjet printing step, wherein the fifth surface partition surrounds and encloses the fourth surface partition. The fourth and the fifth ceramic material may be different from each other. The fourth and the fifth ceramic material may have one or several features and/or properties which are described in connection with the first and second ceramic materials, respectively.

For example, the fourth ceramic material can be the same material as the first ceramic material and the fifth ceramic material can be the same material as the second ceramic material. Thus, two or more ceramic layers with equal properties can be realized in one single electrical multi-layer component. Alternatively, the fourth and the fifth ceramic materials may be different from the first and the second ceramic materials, for example when different functionalities of the different ceramic materials and/or of the different ceramic layers are required.

By applying even a third or more additional ceramic layers in a similar way the first and/or second ceramic layer is applied, complex three-dimensional structures can be achieved without the need of punching vias.

According to at least one embodiment, an electrical multi-layer component comprises a first ceramic layer on a ceramic substrate. The first ceramic layer comprises a first ceramic material on a first surface partition of the substrate and a second ceramic material on a second surface partition of the substrate wherein the second surface partition surrounds and encloses the first surface partition and wherein the second ceramic material is different from the first ceramic material. The first surface partition has a surface area which is equal to or smaller than 500 µm times 500 µm.

According to another embodiment, the electrical multi-layer component is produced by a method having at least one or a plurality of features, steps and/or embodiments of the method described above. In particular, features and embodiments, which are described herein in connection with the method, may also apply to the electrical multi-layer component and vice versa.

According to a further embodiment, the electrical multi-layer component further comprises a first electrode layer and a second electrode layer, wherein the first electrode layer is applied to the substrate, the first ceramic layer is applied upon the first electrode layer and the second electrode layer is applied upon the first ceramic layer. A top ceramic layer may be applied upon the second electrode layer and the first and the second electrode layers may be in direct contact with the first ceramic material.

According to another embodiment, the first surface partition has a surface area which is equal to or smaller than 100 µm times 100 µm and the first ceramic layer has a thickness of equal to or less than 40 µm, preferably equal to or less than 20 µm.

Further features, advantages and expediencies will become apparent from the following description of exemplary embodiments in conjunction with the figures.

FIG. 1 shows a schematic view of an electrical multi-layer component with a first ceramic layer on a ceramic substrate according to an embodiment.

FIGS. 3 to 5 show schematic views of electrical multi-layer components according to further embodiments.

Components that are identical, of identical type and/or act identically are provided with identical reference symbols in the Figures.

FIG. 1 shows an embodiment of an electrical multi-layer component, wherein the electrical multi-layer component comprises a first ceramic layer 2 on a ceramic substrate 1.

Figure 2A:
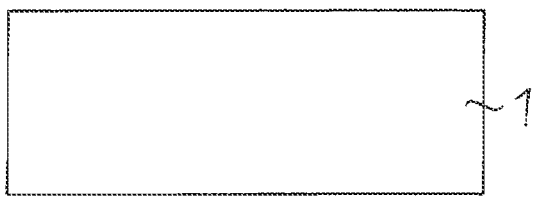
FIG. 2 shows a schematic view of a method for producing an electrical multi-layer component according to another embodiment.

The first ceramic layer 2 comprises a first ceramic material 3 which is applied on a first surface partition 5 of the ceramic substrate 1 and a second ceramic material 4 which is applied on a second surface partition 6 of the ceramic substrate 1. In this particular embodiment the first surface partition 5 has a surface area which is equal to or smaller than 500 µm times 500 µm. The second surface partition 6 surrounds and encloses the first surface partition 5 so that the first ceramic material 3 is laterally surrounded by the second ceramic material 4. The first and the second ceramic materials 3, 4 are applied by a first and second inkjet printing step, respectively, as described above in the general part.

The second ceramic material 4 is different from the first ceramic material 3. In this particular embodiment the first ceramic material 3 is barium strontium titanate and the second ceramic material 4 is magnesium oxide. Those materials are suitable for example for electrical multi-layer components which are formed as varactors. Depending on the required properties of the electrical multi-layer component, the first and the second ceramic materials 3, 4 may also comprise additional or alternative ceramic materials. Further, the multilayer component may comprise further layers, for example electrode layers and/or ceramic layers.

In general, the choice of materials and/or the dimensions of the first and second ceramic material, for instance the thickness of the first ceramic layer 2, which is formed by the first and the second ceramic material 3, depend on the requirements of the electrical multi-layer component. For instance, the tunability of a varactor for a defined bias voltage or the breakdown voltage of a varistor for a defined grain size can be regulated by the thickness of the ceramic layers of the component.

In the particular embodiment shown in connection with FIG. 1, the first ceramic layer 2 preferably has a thickness of equal to or less than 100 µm, more preferably of equal to or less than 50 µm.

FIGS. 2A to 2E show a schematic view of a method for producing an electrical multi-layer component according to another embodiment, wherein each of the FIGS. 2A to 2E shows a top view of the component after a respective process step. Only for exemplary reasons FIGS. 2A to 2E show a method for producing a varactor component as electrical multi-layer component. However, the method may be applicable also for producing other electrical multi-layer components, for example varistor, capacitor and/or inductor components. Accordingly, the method is not restricted to the materials described in the following but is also applicable to other materials depending on the particular electrical multi-layer component. Moreover, any dimensions specified in the following are nonrestrictive and can be different depending on the requirements of the particular electrical multi-layer component.

FIG. 2A shows in an exemplary embodiment a ceramic substrate 1 suitable for the electrical multi-layer component, which is made of magnesium oxide. The substrate 1 has an upper surface area of 500 µm times 1000 µm, which is depicted in FIG. 2A. Alternatively, the substrate 1 may comprise additional or alternative materials, for example another ceramic material, and its surface area may have different dimensions depending on the desired properties of the electrical multi-layer component that is to be produced.

Figure 2B:
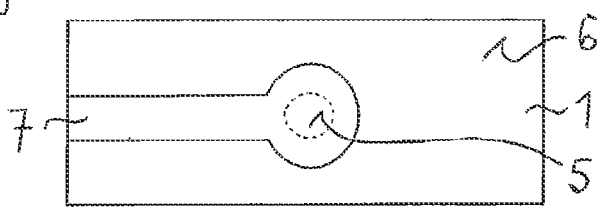

In a further process step according to FIG. 2B a first electrode layer 7 is applied to the ceramic substrate 1 by inkjet printing. The first electrode layer 7 has the shape of a narrow bar reaching from the border of the substrate 1 to a circular end part, which is designated to contact an active region of the multi-layer component that is produced by means of the following process steps.

The substrate 1 has a first surface partition 5, depicted with a dashed line, which has a circular shape and is located in the region of the circular ending of the first electrode layer 7. The first surface partition 5 has a diameter of preferably 100 µm. A second surface partition 6 is formed by the remaining surface of the ceramic substrate 1 surrounding and enclosing the first surface partition 5, i.e. the whole surface of the substrate 1 excluding the surface part formed by the first surface partition 5.

Figure 2C:
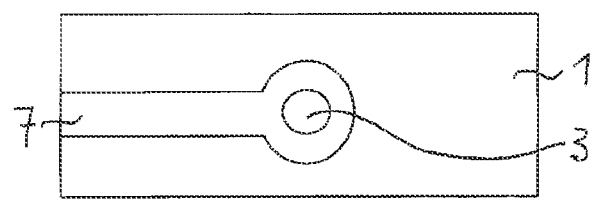

In a further process step according to FIG. 2C a first ceramic material 3 is applied to the first surface partition 5 upon the first electrode layer 7. The first ceramic material 3 is applied by a first inkjet printing step as described in detail in the general part of the description above and comprises barium strontium titanate in the particular embodiment.

Figure 2D:
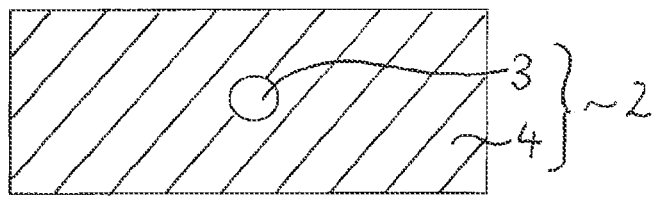

In a further process step according to FIG. 2D a second ceramic material 4 is applied upon the second surface partition 6 by a second inkjet printing step as described in detail in the general part of the description above. As a result the ceramic substrate 1 and the first electrode layer 7 are covered by the second ceramic material 4 excluding the first surface partition 5 to which the first ceramic material 3 was applied before. The second ceramic material 4 comprises magnesium oxide in the particular embodiment. Alternatively, the second ceramic material 4 can be applied before or simultaneously with the first ceramic material 3. The first and second ceramic material 3, 4 form a first ceramic layer 2 on the substrate 1.

Figure 2E:
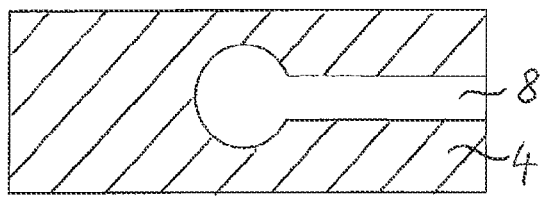

In a further process step according to FIG. 2E a second electrode layer 8 is applied by inkjet printing to the first ceramic layer 2, i.e. upon the first ceramic material 3 and a part of the second ceramic material 4. The second electrode layer 8 has a similar shape as the first electrode layer 7 and the circular end part of the second electrode layer 8 is covering the first ceramic material 3.

All materials, in particular the first and second ceramic materials 3, 4, are applied to the substrate 1 by inkjet printing steps. Therefore problems related to the precision in cutting and stacking of screen printed sheets can be avoided and the required amount of metal paste and metal surface can be minimized. Moreover, by using the inkjet printing technique complex 3D structures can be obtained without the need of punching vias into a ceramic layer.

FIG. 3 shows a schematic sectional view of an electrical multi-layer component according to another embodiment, which is formed by a method according to the previous embodiment in connection with FIGS. 2A to 2E. Accordingly, the multi-layer component shown in FIG. 3 is formed a varactor component in the particular embodiment. In addition, a top ceramic layer 16 comprising magnesium oxide is applied upon the first ceramic layer 2 and the second electrode layer 8 by inkjet printing. For such a design, the estimated industrial production is typically higher than 600 million of parts per year and per printer according to commercially available ink jet printer working on 300×300 $mm^2$ support.

The electrical multi-layer component shown in FIG. 3, which is formed by the ceramic substrate, the first ceramic layer 2 comprising the first and the second ceramic material 3, 4, the first and second electrode layers 7, 8 and the top ceramic layer 16 has dimensions of about 1.0 mm times 0.5 mm times 0.25 mm.

The first ceramic layer 2 which comprises the first and the second ceramic material 3, 4 has a thickness of about 25 μm. The first ceramic material 3, which is barium strontium titanate in the particular embodiment, has a high relative permittivity of more than 500 and is enclosed by the second ceramic material 4, which is magnesium oxide in the particular embodiment, with a far lower relative permittivity of approximately 10. The first ceramic material 3 is in direct contact with the first electrode layer 7 and the second electrode layer 8 and forms an active region with an active dielectric surface between the first and the second electrode layer 7, 8.

Simulation results of the electric field and of the electric flux density within an electrical multi-layer component as shown in FIG. 3 have demonstrated a good concentration of the electric flux lines and a homogenous electric field within the dielectric material, i.e. within the first ceramic material. The simulations have also shown a low spread in capacity in the multi-layer component and a significant decrease of the stray capacity within the component compared to conventional electrical varactor components with a continuous layer made of the first ceramic material between line-shaped screen printed electrodes that overlap in an active region of comparable size. Thus, the method described herein allows the production of a electrical multi-layer component which shows low spread in capacity due to a better control of the sizes and dimensions of the respective elements and therefore also of the dielectric surface and the electrodes. In particular, the first ceramic layer 2 comprising the first and second ceramic materials 3, 4 and their particular design helps to decrease the stray capacity so that a homogeneous electric filed in the whole volume of the first ceramic layer can be obtained.

Figure 4:
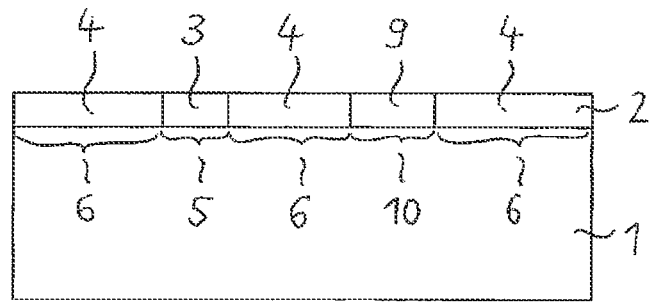

FIG. 4 shows a schematic view of an electrical multi-layer component according to a further embodiment, wherein, compared to the embodiment shown in FIG. 1, the first ceramic layer 2 comprises a third ceramic material 9 on a third surface partition 10 of the substrate 1. The second surface partition 6 surrounds and encloses both the first surface partition 5 and the third surface partition 10 which means that the second ceramic material 4 encloses and laterally surrounds both the first ceramic material 3 and the third ceramic material 9. The third ceramic material 9 and the first ceramic material 3 may be the same material, for example when more than one active region with the same functionalities within the first ceramic layer 1 are needed. Alternatively, the third ceramic material 9 may be different from the first ceramic material 3 in case that more than active region with different functionalities within the first ceramic layer are desired.

The first ceramic layer 2 may also comprise a fourth and/or further ceramic materials according to its required properties. Furthermore, the first ceramic layer 2, in particular the first and third ceramic material 3, 9, may be in direct contact with one or more common or distinct electrode layers depending on the requirements of the electrical multi-layer component.

Figure 5:
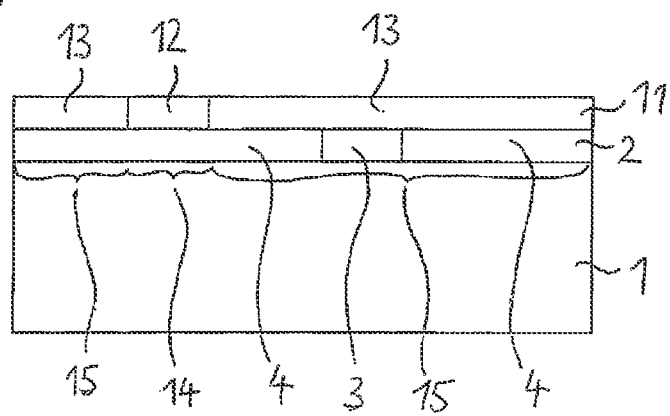

FIG. 5 shows a schematic view of an embodiment of an electrical multi-layer component as in FIG. 1 wherein additionally a second ceramic layer 11 is applied by inkjet printing upon the first ceramic layer 2. The second ceramic layer comprises a fourth ceramic material 12 on a fourth surface partition 14 and a fifth ceramic material 13 on a fifth surface partition 15 wherein the fifth surface partition 15 surrounds and encloses the fourth surface partition 14. The fourth ceramic material 12 is different from the fifth ceramic material 13.

In addition, the second ceramic layer 11 may be in contact with one or more electrode layers and a third and/or further ceramic layers may be applied to the second ceramic layer 11. Thus, electrical multi-layer components comprising several ceramic layers with the same or different functionalities can be designed.

The method and the electrical multi-layer components according to the embodiments shown in the Figures may additionally or alternatively comprise features or combinations of features as described above in the general part.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

REFERENCES 1 ceramic substrate
2 first ceramic layer
3 first ceramic material
4 second ceramic material
5 first surface partition
6 second surface partition
7 first electrode layer
8 second electrode layer
9 third ceramic material
10 third surface partition
11 second ceramic layer
12 fourth ceramic material
13 fifth ceramic material
14 fourth surface partition
15 fifth surface partition
16 top ceramic layer

What is claimed is:

1. A method for producing an electrical multi-layer component, comprising the steps:
   providing a ceramic substrate; and
   applying a first ceramic layer to the substrate,
   wherein the first ceramic layer comprises a first ceramic material and a second ceramic material, the first ceramic material is applied to a first surface partition of the substrate by a first inkjet printing step, and the second ceramic material is applied to a second surface partition of the substrate by a second inkjet printing step,
   wherein the second surface partition surrounds and encloses the first surface partition, and
   wherein the second ceramic material is different from the first ceramic material.

2. The method according to claim 1, wherein the first surface partition has a surface area which is equal to or smaller than 500 µm times 500 µm, preferably equal to or smaller than 100 µm times 100 µm.

3. The method according to claim 1 or 2, wherein the first ceramic layer has a thickness of equal to or less than 100 µm, preferably of equal to or less than 50 µm.

4. The method according to claim 1, wherein a first electrode layer is applied to the substrate, the first ceramic layer is applied upon the first electrode layer, and a second electrode layer is applied to the first ceramic layer.

5. The method according to claim 4, wherein the first and second electrode layers are in direct contact with the first ceramic material.

6. The method according to claim 1, wherein the first ceramic material has a first relative permittivity and the second ceramic material has a second relative permittivity which is smaller than the first relative permittivity.

7. The method according to claim 6, wherein the ratio of the first relative permittivity to the second relative permittivity is equal to or greater than 10.

8. The method according to claim 1, wherein the first ceramic material is a varactor material or a varistor material.

9. The method according to claim 1, wherein the first ceramic material and the second ceramic material are sintered simultaneously.

10. The method according to claim 1, wherein a third ceramic material is applied to at least a third surface partition of the substrate by a third inkjet printing step, and
wherein the second surface partition surrounds and encloses the third surface partition.

11. The method according to claim 1, wherein a second ceramic layer comprising a fourth and a fifth ceramic material is applied to the substrate upon or below the first ceramic layer,
wherein the fourth ceramic material is applied upon a fourth surface partition of the substrate by a fourth inkjet printing step,
wherein the fifth ceramic material is applied upon a fifth surface partition of the substrate by a fifth inkjet printing step,
wherein the fifth surface partition surrounds and encloses the fourth surface partition, and
wherein the fourth and the fifth ceramic material are different from each other.

12. An electrical multi-layer component comprising:
a first ceramic layer on a ceramic substrate,
wherein the first ceramic layer comprises a first ceramic material on a first surface partition of the substrate and a second ceramic material on a second surface partition of the substrate,
wherein the second ceramic material is different from the first ceramic material,
wherein the second surface partition surrounds and encloses the first surface partition,
wherein the first surface partition has a surface area which is equal to or smaller than 500 µm times 500 µm,
wherein the first and second ceramic materials are applied in inkjet printing.

13. The component according to claim 12, wherein the component is produced by a method comprising:
providing a ceramic substrate; and
applying a first ceramic layer to the substrate,
wherein the first ceramic layer comprises a first ceramic material and a second ceramic material, the first ceramic material is applied to a first surface partition of the substrate by a first inkjet printing step, and the second ceramic material is applied to a second surface partition of the substrate by a second inkjet printing step,
wherein the second surface partition surrounds and encloses the first surface partition, and
wherein the second ceramic material is different from the first ceramic material.

14. The component according to claim 12 or 13, further comprising:
a first electrode layer and a second electrode layer,
wherein the first electrode layer is applied to the substrate, the first ceramic layer is applied upon the first electrode layer, the second electrode layer is applied upon the first ceramic layer, a top ceramic layer is applied upon the second electrode layer, and the first and the second electrode layers are in direct contact with the first ceramic material.

15. The component according to claim 12, wherein the first surface partition has a surface area which is equal to or smaller than 100 µm times 100 µm and the first ceramic layer has a thickness of equal to or less than 40 µm.

* * * * *